(12) United States Patent
Allen et al.

(10) Patent No.: US 7,230,463 B2
(45) Date of Patent: Jun. 12, 2007

(54) METHOD AND APPARATUS FOR CONTROLLING TRANSITION RATES ON ADJACENT INTERCONNECTS

(75) Inventors: David Howard Allen, Rochester, MN (US); Gene Steven Van Grinsven, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 11/094,710

(22) Filed: Mar. 30, 2005

(65) Prior Publication Data

US 2006/0226882 A1 Oct. 12, 2006

(51) Int. Cl.
*H03K 5/12* (2006.01)
(52) U.S. Cl. ...................... 327/170; 327/112
(58) Field of Classification Search ............... 327/170, 327/112; 326/87
See application file for complete search history.

(56) References Cited

U.S. PATENT DOCUMENTS

| | | | | |
|---|---|---|---|---|
| 5,933,021 A | * | 8/1999 | Mohd | ........................ 326/30 |
| 6,114,895 A | * | 9/2000 | Stephens | ..................... 327/391 |
| 6,297,674 B1 | * | 10/2001 | Kono et al. | .................. 327/108 |
| 6,515,503 B2 | * | 2/2003 | Griffin et al. | .................. 326/30 |
| 6,603,334 B1 | * | 8/2003 | Takahashi | .................... 327/108 |

* cited by examiner

*Primary Examiner*—Long Nguyen
(74) *Attorney, Agent, or Firm*—Joan Pennington

(57) ABSTRACT

A method, and apparatus are provided for controlling transition rates on adjacent interconnects in an electronic chip design. Each interconnect includes a first inverter that receives a net input and provides an initial inverted output and a second inverter coupled to the first inverter receiving the initial inverted output and providing a net output. A first compensating logic transistor stack coupled to the first inverter and a first adjacent net receives the initial inverted output and the first adjacent net input for selectively providing conductive paths. A second compensating logic transistor stack coupled to the first inverter and a second adjacent net receiving the initial inverted output and the second adjacent net input for selectively providing conductive paths.

17 Claims, 3 Drawing Sheets

METHOD AND APPARATUS FOR CONTROLLING TRANSITION RATES ON ADJACENT INTERCONNECTS

FIELD OF THE INVENTION

The present invention relates generally to the field of semiconductor devices, and more particularly, relates to a method, and apparatus for controlling transition rates on adjacent interconnects in an electronic chip design.

DESCRIPTION OF THE RELATED ART

VLSI designs rely on metal wiring or nets to transmit signals large distances. Controlling the transition rates on these nets is a major challenge to timing closure.

For example, if transition rates are too slow, the cycle time is not met and excess power is dissipated in circuits that are gated by the slow signal. If transition rates are too fast, a fast net can capacitively couple to an adjacent net, particularly if the adjacent net is inherently slower. When a fast net acts as a hostile neighbor, slowing down the transition of a slower net, it has an undesirable impact on the overall impact on power and frequency.

This can occur anywhere on a chip, but is most likely to occur in engineered buses where there are multiple signals, which tend to switch simultaneously. For example, multiple signal lines of a data bus are intentionally designed to be physically near each other to facilitate the floor-planning and wiring processes. A failure mechanism that is frequently observed in hardware is caused by two or more adjacent hostile nets transitioning in the same direction slowing down the transition of a victim wire, which is transitioning in the opposite direction.

FIG. 1 illustrates a simplified view of a conventional engineered bus including wires 102 and multiple levels of buffers 104. Buffers 104 are typically placed at the maximum distance, which still allows the transition rate limit to be met, typically set by project design practices.

FIG. 2 illustrates simple prior art buffers 104 that are formed by a series of two static CMOS inverters respectively illustrated by a first inverter 202 and a second inverter formed by a P-channel field effect transistor (PFET) 204 and an N-channel field effect transistor (NFET) 206. PFET 204 and NFET 206 having a gate input of the output of the first inverter 202 is connected between the positive voltage power supply VDD and ground.

Balancing the transition rates on nets so that the nets are fast enough under worst case conditions, such as when adjacent neighbors are transitioning in the opposite direction, without being so fast under best case conditions, such as when adjacent neighbors are transitioning in the same direction such that the nets themselves capacitively couple to slower nets and result in timing violations.

A need exists for an effective mechanism for controlling transition rates on adjacent interconnects in an electronic chip design.

SUMMARY OF THE INVENTION

Principal aspects of the present invention are to provide a method, and apparatus for controlling transition rates on adjacent interconnects in an electronic chip design. Other important aspects of the present invention are to provide such method, and apparatus for controlling transition rates on adjacent interconnects in an electronic chip design substantially without negative effect and that overcome some of the disadvantages of prior art arrangements.

In brief, a method, and apparatus are provided for controlling transition rates on adjacent interconnects in an electronic chip design. Each interconnect includes a first inverter that receives a net input and provides an initial inverted output. A second inverter coupled to the first inverter receives the initial inverted output and provides a net output. A first compensating logic transistor stack coupled to the first inverter and a first adjacent net receives the initial inverted output and the first adjacent net input for selectively providing conductive paths. A second compensating logic transistor stack coupled to the first inverter and a second adjacent net receiving the initial inverted output and the second adjacent net input for selectively providing conductive paths.

In accordance with features of the invention, automatic compensation is achieved by the first and second compensating logic transistor stacks that monitor a state of adjacent nets and detect an equivalent or opposite state, and then selectively adjust a transition of the net responsive to the detected equivalent or opposite state by selectively providing conductive paths.

In accordance with features of the invention, the first and second compensating logic transistor stacks provide conductive paths responsive to data of opposite polarity on the respective adjacent net output to compensate for the coupling capacitance caused by the adjacent net output.

In accordance with features of the invention, each of the first and second compensating logic transistor stacks include a P-channel field effect transistor (PFET) and an N-channel field effect transistor (NFET) that are respectively controlled by the first adjacent net input and the second adjacent net input. When the first adjacent net input is in the same state as the net input, then these PFET and NFET of the first compensating logic transistor stack block the additional conductive paths. Likewise when the second adjacent net input is in the same state as the net input, then these PFET and NFET of the second compensating logic transistor stack block the additional conductive paths when the initial inverted output transitions low or high.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method, and apparatus are provided for controlling transition rates on adjacent interconnects in an electronic chip design. Compensating for the transition of adjacent nets is automatically provided. This automatic compensation is achieved by logic circuits that monitor the state and/or transition of adjacent nets and detect an equivalent or opposite state, and then adjust the transition of the subject net appropriately.

Figure 3:
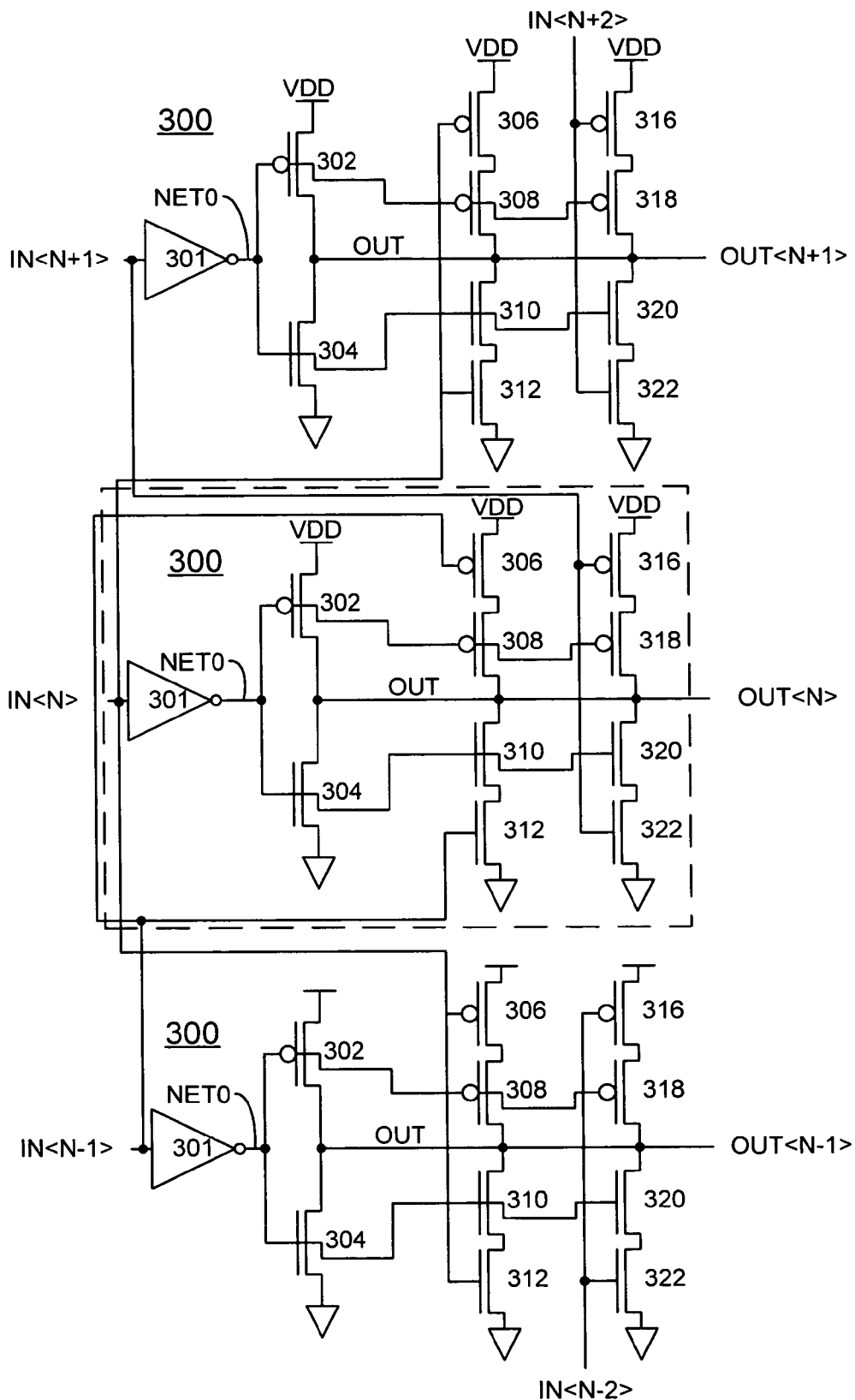
FIG. 3 is a schematic diagram of apparatus for controlling transition rates on adjacent interconnects in accordance with the preferred embodiment.

Having reference now to the drawings, in FIG. 3, there is shown apparatus for controlling transition rates on adjacent interconnects in accordance with the preferred embodiment generally designated by the reference character 300. A box drawn with a dotted line represents one instance of apparatus 300 forming the preferred embodiment. Two additional instances of the apparatus 300 are shown to illustrate operation of the preferred embodiment of the invention.

Apparatus 300 includes a first inverter 301 receiving an input at a node labeled IN and providing an inverted output at a node labeled NET0. A second inverter formed by a series connected P-channel field effect transistor (PFET) 302 and an N-channel field effect transistor (NFET) 304. PFET 302 and NFET 304 having a gate input at node NET0 of the output of the first inverter 301 is connected between the positive voltage power supply VDD and ground. An output at a node labeled OUT of the second inverter is provided at a common drain connection of PFET 302 and NFET 304.

Apparatus 300 includes a first compensating logic transistor stack including a pair of series connected PFETs 306, 308 connected in series with a pair of series connected NFETs 310, 312. A source of PFET 306 is connected to the positive voltage power supply VDD and a source of NFET 312 is connected to ground. A common drain connection of PFET 308 and NFET 310 is connected to the output of the second inverter at node OUT. PFET 308 and NFET 310 have a gate input at node NET0 of the output of the first inverter 301. PFET 306 and NFET 310 have a gate input of an input IN of a first adjacent net, such as IN<N−1> for the illustrated instance of apparatus 300 shown in dotted line.

Apparatus 300 includes a second compensating logic transistor stack including a pair of series connected PFETs 316, 318 connected in series with a pair of series connected NFETs 320, 322. A source of PFET 316 is connected to the positive voltage power supply VDD and a source of NFET 322 is connected to ground. A common drain connection of PFET 318 and NFET 320 is connected to the output of the second inverter at node OUT. PFET 318 and NFET 320 have a gate input at node NET0 of the output of the first inverter 301. PFET 316 and NFET 320 have a gate input of an input IN of a second adjacent net, such as IN<N+1> for the illustrated instance of apparatus 300 shown in dotted line.

Figure 1:
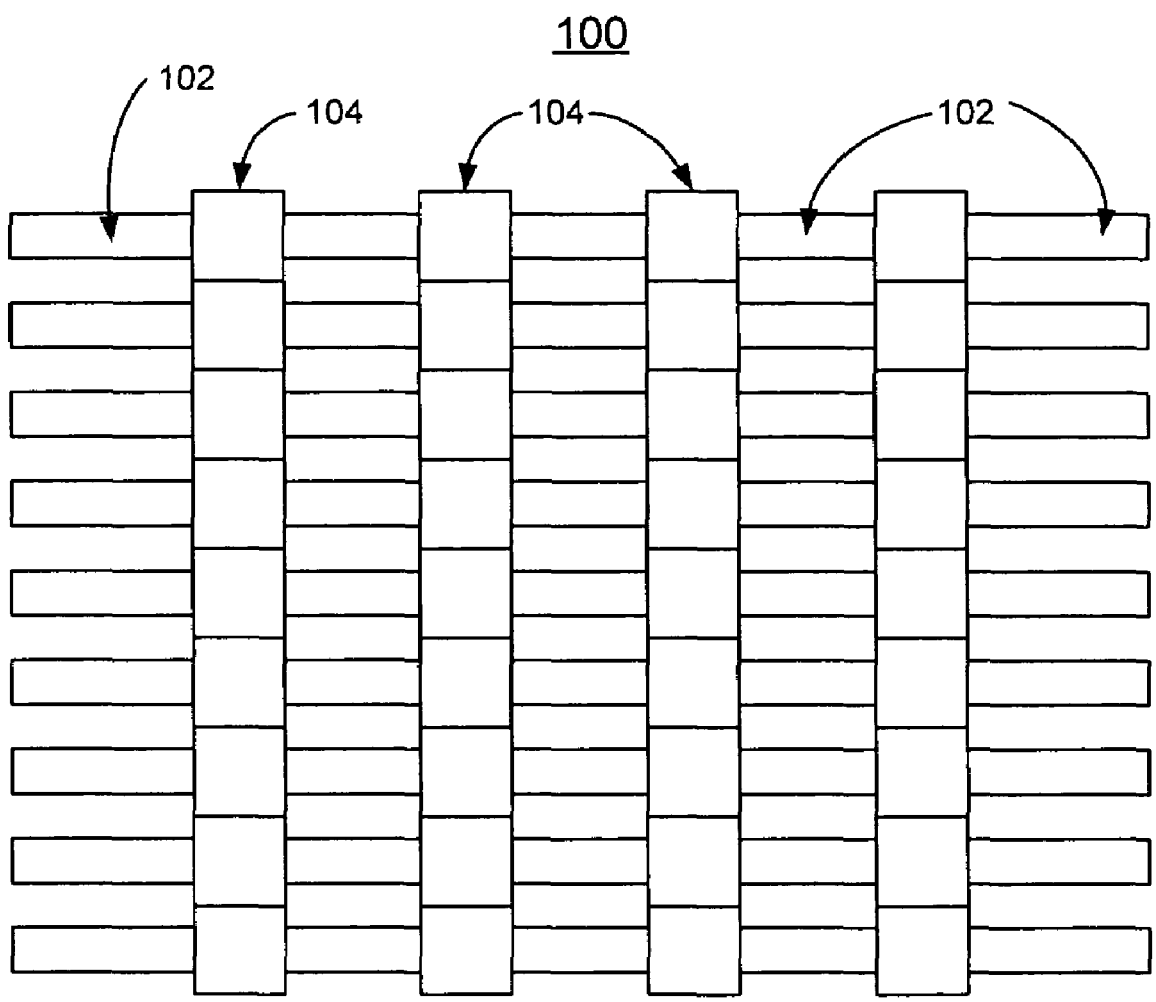
FIG. 1 illustrates a simplified view of wires and buffers in a conventional engineered bus.
Figure 2:
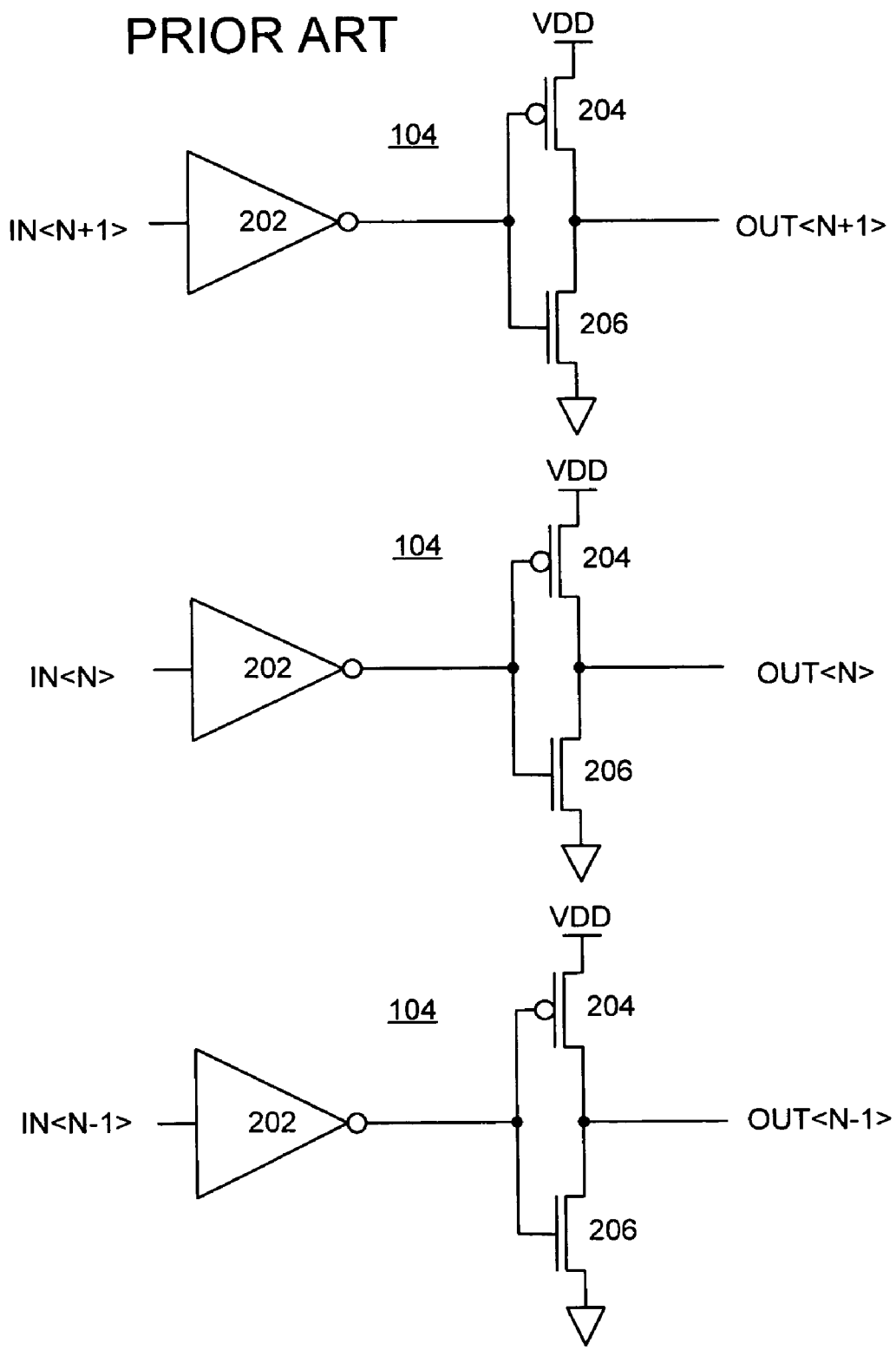
FIG. 2 is a schematic diagram of simple prior art buffers formed by a series of two static CMOS inverters.

The operation of apparatus 300 may be understood as follows. When IN<N> switches high or low, NET0 will switch low or high, respectively. Transistors PFET 302 and NFET 304 respond by creating conducting paths to VDD or ground respectively which causes net OUT<N> to transition high or low respectively exactly as in the prior art buffer arrangement shown in FIG. 2. The new transistors PFETs 306, 308 and NFETs 310, 312 of the first compensating logic transistor stack selectively provide additional conducting paths to VDD or ground respectively. When NET0 switches low or high PFETs 306, 308 and NFETs 310, 312 provide additional conducting paths to VDD or ground respectively only if net IN<N−1> is low or high respectively. This means that data of opposite polarity to net IN<N> on adjacent net IN<N−1>, which will result in data of opposite polarity to OUT<N> on adjacent net OUT<N−1>, will enable additional drive current on net OUT<N> to compensate for the coupling capacitance caused by adjacent net OUT<N−1>.

If, however, IN<N−1> is in the same state as IN<N>, which means that OUT<N> will transition to the same state as OUT<N−1>, then transistors PFET 306 and NFET 312 will block the additional conducting path to VDD or ground when NET0 transitions low or high, providing less drive on net OUT<N>, which is what is desired since the effect on the transition rate on OUT<N> caused by coupling to OUT<N−1> is less in this case.

The additional new transistors PFETs 316, 318 and NFETs 320, 322 of the second compensating logic transistor stack perform a similar function to selectively provide additional conducting paths to VDD or ground respectively as the first compensating logic transistor stack, except that the additional conducting paths are controlled by the second or other adjacent net IN<N+1>.

While the present invention has been described with reference to the details of the embodiments of the invention shown in the drawing, these details are not intended to limit the scope of the invention as claimed in the appended claims.

What is claimed is:

1. Apparatus for controlling transition rates on adjacent interconnects in an electronic chip design, each interconnect comprising:
   a first inverter receiving a net input and providing an initial inverted output;
   a second inverter coupled to said first inverter receiving said initial inverted output and providing a net output;
   a first compensating logic transistor stack coupled to said first inverter and a first adjacent net receiving said initial inverted output and a first adjacent net input for selectively providing conductive paths; and
   a second compensating logic transistor stack coupled to said first inverter and a second adjacent net receiving said initial inverted output and a second adjacent net input for selectively providing conductive paths.

2. Apparatus for controlling transition rates on adjacent interconnects as recited in claim 1 wherein each said first and second compensating logic transistor stack provides conductive paths responsive to data of opposite polarity on said respective adjacent net output.

3. Apparatus for controlling transition rates on adjacent interconnects as recited in claim 1 wherein each said first and second compensating logic transistor stack include a P-channel field effect transistor (PFET) and an N-channel field effect transistor (NFET); said PFET and said NFET being respectively controlled by the first adjacent net input and the second adjacent net input.

4. Apparatus for controlling transition rates on adjacent interconnects as recited in claim 3 wherein said PFET and NFET of the first compensating logic transistor stack block said conductive paths responsive to the first adjacent net input having the same state as the net input when said initial inverted output transitions low or high.

5. Apparatus for controlling transition rates on adjacent interconnects as recited in claim 3 wherein said PFET and NFET of the second compensating logic transistor stack block said conductive paths responsive to the second adjacent net input having the same state as the net input when said initial inverted output transitions low or high.

6. Apparatus for controlling transition rates on adjacent interconnects as recited in claim 1 wherein each said first and second compensating logic transistor stack includes a pair of series connected P-channel field effect transistors (PFETs) and a pair of series connected N-channel field effect transistor (NFETs) connected in series between a positive voltage power supply and ground.

7. Apparatus for controlling transition rates on adjacent interconnects as recited in claim 6 wherein a common drain connection of the series connected PFET and NFET of each said first and second compensating logic transistor stack is connected to said net output.

8. Apparatus for controlling transition rates on adjacent interconnects as recited in claim 6 wherein a respective one of said pair of series connected PFETs and said pair of series connected NFETs has a gate connected to said respective adjacent net input; and a respective other one of said pair of series connected PFETs and said pair of series connected NFETs has a gate connected to said initial inverted output.

9. A method for controlling transition rates on adjacent interconnects in an electronic chip design, each interconnect including a first inverter receiving a net input and providing an initial inverted output; and a second inverter coupled to said first inverter receiving said initial inverted output and providing a net output; said method comprising the steps of:
    providing a first compensating logic transistor stack coupled to said first inverter and a first adjacent net;
    providing a second compensating logic transistor stack coupled to said first inverter and a second adjacent net; and
    each said first and second compensating logic transistor stack monitoring a state of said respective first and second adjacent net to detect an equivalent or opposite state, and selectively adjusting a transition of the net output responsive to the detected equivalent or opposite state.

10. A method for controlling transition rates on adjacent interconnects as recited in claim 9 wherein the step of selectively adjusting a transition of the net output responsive to the detected equivalent or opposite state includes the steps of selectively providing conductive paths with each said first and second compensating logic transistor stack.

11. A method for controlling transition rates on adjacent interconnects as recited in claim 9 wherein the step of selectively adjusting a transition of the net output responsive to the detected equivalent or opposite state includes the steps of providing respective conductive paths with said first compensating logic transistor stack responsive to an opposite state of said first adjacent net.

12. A method for controlling transition rates on adjacent interconnects as recited in claim 9 wherein the step of selectively adjusting a transition of the net output responsive to the detected equivalent or opposite state includes the steps of blocking respective conductive paths with said first compensating logic transistor stack responsive to an equivalent state of said first adjacent net.

13. A method for controlling transition rates on adjacent interconnects as recited in claim 9 wherein the step of selectively adjusting a transition of the net output responsive to the detected equivalent or opposite state includes the steps of providing respective conductive paths with said second compensating logic transistor stack responsive to an opposite state of said second adjacent net.

14. A method for controlling transition rates on adjacent interconnects as recited in claim 9 wherein the step of selectively adjusting a transition of the net output responsive to the detected equivalent or opposite state includes the steps of blocking respective conductive paths with said second compensating logic transistor stack responsive to an equivalent state of said second adjacent net.

15. A method for controlling transition rates on adjacent interconnects as recited in claim 9 wherein each of the steps of providing said first compensating logic transistor stack and providing said second compensating logic transistor stack include providing a pair of series connected P-channel field effect transistors (PFETs) and a pair of series connected N-channel field effect transistor (NFETs) connected in series between a positive voltage power supply and ground; and applying a gate input of said respective adjacent net input to a respective one of said pair of series connected PFETs and said pair of series connected and applying a gate input of said initial inverted output to a respective other one of said pair of series connected PFETs and said pair of series connected NFETs.

16. Apparatus for controlling transition rates on adjacent interconnects in an electronic chip design, each interconnect comprising:
    a first inverter receiving a net input and providing an initial inverted output;
    a second inverter coupled to said first inverter receiving said initial inverted output and providing a net output;
    a first compensating logic transistor stack coupled to said first inverter and a first adjacent net receiving said initial inverted output and a first adjacent net input for selectively providing conductive paths;
    a second compensating logic transistor stack coupled to said first inverter and a second adjacent net receiving said initial inverted output and a second adjacent net input for selectively providing conductive paths; and
    each said first compensating logic transistor stack and said second compensating logic transistor stack providing conductive paths, responsive to data of opposite polarity on said respective adjacent net output; and blocking conductive paths, responsive to data of equivalent polarity on said respective adjacent net output.

17. Apparatus for controlling transition rates on adjacent interconnects as recited in claim 16 wherein each said first compensating logic transistor stack and said second compensating logic transistor stack includes a pair of series connected P-channel field effect transistors (PFETs) and a pair of series connected N-channel field effect transistor (NFETs) connected in series; and a gate input of said respective adjacent net input being applied to a respective one of said pair of series connected PFETs and said pair of series connected NFETs and a gate input of said initial inverted output being applied to a respective other one of said pair of series connected PFETs and said pair of series connected NFETs.

* * * * *